United States Patent
Chen et al.

[11] Patent Number: 6,150,186
[45] Date of Patent: Nov. 21, 2000

[54] METHOD OF MAKING A PRODUCT WITH IMPROVED MATERIAL PROPERTIES BY MODERATE HEAT-TREATMENT OF A METAL INCORPORATING A DILUTE ADDITIVE

[75] Inventors: Jimmy Kuo-Wei Chen, Pleasanton; Benjamin N. Eldridge, Danville; Thomas H. Dozier; Junjye J. Yeh, both of Livermore; Gayle J. Herman, Danville, all of Calif.

[73] Assignee: FormFactor, Inc., Livermore, Calif.

[21] Appl. No.: 09/217,589

[22] Filed: Dec. 22, 1998

Related U.S. Application Data

[60] Division of application No. 08/931,923, Sep. 17, 1997, and a continuation-in-part of application No. 08/452,255, May 26, 1995, and a continuation-in-part of application No. 08/819,464, Mar. 17, 1997.

[51] Int. Cl.$^7$ .................................................. H01L 21/66
[52] U.S. Cl. ................................ 438/14; 438/15; 438/17; 438/18; 438/117; 438/617
[58] Field of Search ............................. 29/843, 840, 842; 257/777, 779, 780, 781; 228/180.5; 438/117, 611, 617, 14, 15, 18, 106, 17

[56] References Cited

U.S. PATENT DOCUMENTS

| | | | |
|---|---|---|---|
| 3,662,454 | 5/1972 | Miller | 29/470.1 |
| 4,955,523 | 9/1990 | Calomagno et al. | 228/179 |
| 5,189,507 | 2/1993 | Carlomango et al. | 257/77 |
| 5,302,550 | 4/1994 | Hirota et al. | 438/106 |
| 5,476,211 | 12/1995 | Khandros | 228/180.5 |
| 5,495,667 | 3/1996 | Farnworth et al. | 29/843 |
| 5,601,740 | 2/1997 | Eldrige et al. | 219/130.4 |
| 5,772,451 | 6/1998 | Dozier, II et al. | 439/70 |
| 5,832,601 | 11/1998 | Elridge et al. | 29/843 |
| 5,864,946 | 2/1999 | Elridge et al. | 29/843 |
| 5,884,398 | 3/1999 | Elridge et al. | 29/843 |
| 5,897,326 | 4/1999 | Eldridge et al. | 438/14 |
| 5,917,707 | 6/1999 | Khandros et al. | 361/776 |
| 5,926,951 | 7/1999 | Khandros et al. | 29/843 |
| 5,994,152 | 11/1999 | Khandros et al. | 438/617 |
| 6,049,976 | 4/2000 | Khandros | 29/843 |

FOREIGN PATENT DOCUMENTS

| | | |
|---|---|---|
| 60-150657 | 8/1985 | Japan . |
| 3-142847 | 6/1991 | Japan . |
| 465840 | 3/1992 | Japan . |

*Primary Examiner*—John Guay
*Assistant Examiner*—Alonzo Chambliss
*Attorney, Agent, or Firm*—David Larwood

[57] ABSTRACT

Deposition of metal in a preferred shape, including coatings on parts, or stand-alone materials, and subsequent heat treatment to provide improved mechanical properties. In particular, the method gives products with relatively high yield strength. The products often have relatively high elastic modulus, and are thermally stable, maintaining the high yield strength at temperatures considerably above 25° C. This technique involves depositing a material in the presence of a selected additive, and then subjecting the deposited material to a moderate heat treatment. This moderate heat treatment differs from other commonly employed "stress relief" heat treatments in using lower temperatures and/or shorter times, preferably just enough to reorganize the material to the new, desired form. Coating a shape and heat treating provides a shaped deposit with improved material properties. Coating a shape with a portion connected to a base and a portion detached therefrom can provide a resilient, conductive contact useful for electronic applications.

2 Claims, 6 Drawing Sheets

METHOD OF MAKING A PRODUCT WITH IMPROVED MATERIAL PROPERTIES BY MODERATE HEAT-TREATMENT OF A METAL INCORPORATING A DILUTE ADDITIVE

I. CROSS-REFERENCES TO RELATED APPLICATIONS

This application is a divisional of commonly assigned U.S. patent application Ser. No. 08/931,923, filed on Sep. 17, 1997, and a continuation-in-part of U.S. patent application Ser. No. 08/452,255, filed on May 26, 1995. This application also is a continuation-in-part of U.S. patent application Ser. No. 08/819,464, filed on Mar. 17, 1997.

II. BACKGROUND OF THE INVENTION

1. Technical Field

This invention relates to depositing a material into a selected shape then modifying the initial material to provide desirable mechanical properties. Inclusion of small amounts of an additive allows selective heat treatment to give a material with improved material properties when compared to the properties of the deposited material. In particular, a shaped, soft material may be coated with the new material and heat treated to give a shaped, hardened coating, particularly in the form of a conductive spring.

2. Description of Related Art

The concept of applying a coating to impart desirable mechanical properties is used in many fields, from semiconductors to automobiles. For example, microelectromechanical structures, microelectronic packaging, and magnetic storage media all employ such coatings. A variety of processes from sputtering to electroforming to chemical vapor deposition are widely used to fabricate such coatings. However, the mechanical properties of many of these coatings are not completely stable, especially at elevated temperatures. This is especially true for deposition processes that result in a non-equilibrium structure. Thus parts with these coatings have a fundamental problem in applications which require stable mechanical properties under load, particularly at elevated temperatures.

Annealing, or heating a material at a significantly elevated temperature for an extended period of time, is generally recognized as a way to bring a structure more into equilibrium. Annealing is often used to relieve brittleness. Brittleness often results from various material forming processes. For example, in forming a wire, it is common to extrude the material through a die, which involves various compression and deformation processes. The wire as extruded has the desired shape, but examination of the microstructure of the material reveals large amounts of internal stresses as internal stress fields. If these internal stress fields are high, the material might be considered to be brittle, and will break under moderate applied stresses. Heat treating such a wire will allow the material to reorganize and relieve these internal stress fields.

Heat treatment also is used to redistribute components within a system. For example, it is common in semiconductor processing to apply a dopant such as boron or phosphorous on the surface of a silicon substrate. Heating, or annealing, this product allows redistribution of the dopant atoms within the silicon structure as the dopant atoms diffuse within the base material.

Annealing of metal coatings such as nickel (Ni) also is common in many plating operations. It is quite common to electroplate nickel on a substrate, then anneal at, for example, 700° C. for one to two hours. This is generally to relieve essentially all stress in the coating, so the annealing is continued for a relatively long time and/or at a relatively high temperature. In traditional applications, nickel is plated relatively quickly, which gives a relatively disordered initial structure, which in turn provides many sources for residual stress fields. Annealing allows the material to reach an equilibrium structure, which is much more stable.

Note that a typical annealing heat treatment involves both time and temperature and one skilled in the art can balance higher temperatures against shorter times or vice versa.

Another traditional process is the preparation of thin films for hard disk or other recording surfaces. A thin film of material such as NiP is deposited on a substrate, then annealed to give a hard material.

As semiconductor technology advances and the density of devices on chips increases, increased demands are placed on electrical interconnections in microelectronics packaging and microelectronics diagnostics. The mechanical properties of such interconnections are important in achieving reliable packaging and diagnostic solutions.

For example, it is typically desirable for such interconnections to have some resiliency. Currently, commonly-used technologies in microelectronics packaging exhibit little or no resiliency. Typical packaging includes wirebonding, tape automated bonding (TAB), solder bump technology, pin-in-hole solder, pin brazing, and surface-mount solder. While "pogo" pins used in microelectronics diagnostics are designed to have a resilient mechanical structure, their substantial inductance inhibits the use of high frequency signals by the diagnostics system.

Other resilient structures useful in microelectronics include a class of structures known as micro-electronic mechanical structures or MEMS. A number of researchers have fabricated small structures such as horizontal beams positioned with other electronic components to make devices such as relays. A variety of gears and other mechanical structures have been prepared.

Before the present invention, there was perceived a need to form strong, resilient microstructures but there was no technology that would allow this. Forming microstructures directly from a resilient material is in general quite difficult, if not impossible, in that a resilient material resists specific shaping methods. For example, tungsten needle in convention probe cards can be bent at a 90° angle, positioned, then cut to length, but subtler shaping is extremely difficult.

Before the present invention, it was not possible to plate a coating on a substrate of small (tens to hundreds of microns) or even large (millimeters, centimeters, or larger) minimum feature size to provide resilient characteristics, particularly where it was desirable to have a structure with good mechanical yield strength. This limitation was particularly troublesome when the device was intended for use at moderately elevated temperatures, temperatures in excess of 100° C., 85° or even 50° C. Conventional coatings could not be used to create durable, strong spring structures due to the thermal instability of the resulting coated products. The lack of structures with useful mechanical properties made it extremely difficult to build devices with large numbers of small springs, devices such as a probe card.

Early work in formable microstructures showed that a soft material such as gold could be shaped readily, then plated to give a hard coating and a resilient structure. See U.S. Patent No. 5,476,211, issued Dec. 19, 1995, assigned to FormFactor, Inc, entitled "Method of Manufacturing Electrical Contacts, Using a Sacrificial Member." The work that lead to the present invention showed that use of improved materials, and subsequent heat treatment could provide a strong, resilent final product. The use of these same or similar materials together with appropriate heat treatment can provide a resilient structure in a wide variety of applications.

Plating techniques in general are well known. See, for example, U.S. Pat. No. 4,439,284, "Composition Control of Electrodeposited Nickel-Cobalt Alloys." However, the selection of plating materials and the heat treatment conditions disclosed herein have not been disclosed in the past, in the '284 patent or elsewhere.

One skilled in the art will recognize other applications in which a material with high yield strength would be beneficial. This is particularly true for base materials with an arbitrary and possibly complex shape where retention of that shape is important, or where the base material does not have a sufficiently high yield strength. In particular, when making various spring structures of equivalent geometry and scale, an increase in elastic modulus will increase the spring value proportionally. For a fine-pitch interconnect, achieving greater spring value in a fixed volume is beneficial.

III. SUMMARY OF THE INVENTION

The new invention solves the traditional problem of older materials that do not provide stable mechanical properties under load, particularly at elevated temperatures. The general technique allows fabrication of coatings on parts, or stand-alone coatings, with improved mechanical properties, even at elevated operating temperatures. In particular, the method gives products with a relatively high yield strength, relatively high elastic modulus and improved temperature stability, that is, resistance to deformation under load at elevated temperatures. This technique involves depositing a coating in the presence of additives, and then subjecting the coating to a moderate heat treatment. This moderate heat treatment differs from other commonly employed "stress relief" heat treatments in using a combination of significantly less temperature and/or times. Traditional annealing heat treatment warms the material to a temperature and for a time to relieve essentially all stress after a subsequent cooling. The new technique takes the as-coated material to a more moderate temperature and/or for a shorter time, preferably just enough to reorganize the material to the new, desired form. Mechanical properties improve after the treatment. Yield stress actually increases after the new heat treatment, while the yield stress generally decreases after a typical stress relief heat treatment. See, generally, R. J. Walter, Plating & Surface Finishing, October 1986, pp. 48–53; A. J. Dill, Plating, November 1974, pp. 1001–1004; and A. W. Thompson and H. J. Saxton, Metallurgical Transactions, Vol. 4, June 1973, pp. 1599–1605.

Many materials are suitable for use with the new technique but one particularly preferred system includes nickel or a nickel/cobalt alloy, with small amounts of a sulfur-containing additive such as saccharin. This material is electroplated onto a substrate, then heat treated under moderate conditions.

A preferred method of deposition is electroplating, but other useful deposition processes include chemical vapor deposition (CVD), physical vapor deposition (PVD), electrolytic or electroless aqueous solution plating of metals, and any process that causes deposition of materials through decomposition or reaction of gaseous, liquid or solid precursors.

The new technique of fabricating coatings with stable mechanical properties lends itself to fabricating resilient structures, structures that are critical in many applications such as microelectronic interconnections. In addition to the stable mechanical properties, many of the new coatings provide a structure with high electrical conductivity. Thus, by using this invention, a low-inductance, resilient interconnect can be fabricated.

In one particularly preferred embodiment, the coating is applied to a microspring, such as that described in U.S. Pat. No. 5,476,211, entitled "Method of Manufacturing Electrical Contacts, Using a Sacrificial Member". This technique has been developed in connection with work on such microsprings, particularly for coating wires of some 1–2 mils (about 25–50 microns) thickness with a coating of some 1–2 mils (25–50 microns). In general, the technique is useful in thin film coatings of 200 or more Angstroms thick and for coatings with thick films of millimeter or even centimeter dimensions. One skilled in the art will appreciate that the teachings of this invention are applicable to a wide variety of structures.

This and other objects and advantages of the invention, as well as the details of an illustrative embodiment, will be more fully understood from the following specification and drawings.

IV. BRIEF DESCRIPTION OF THE DRAWINGS

V. DESCRIPTION OF THE PREFERRED EMBODIMENT

Figure 1:
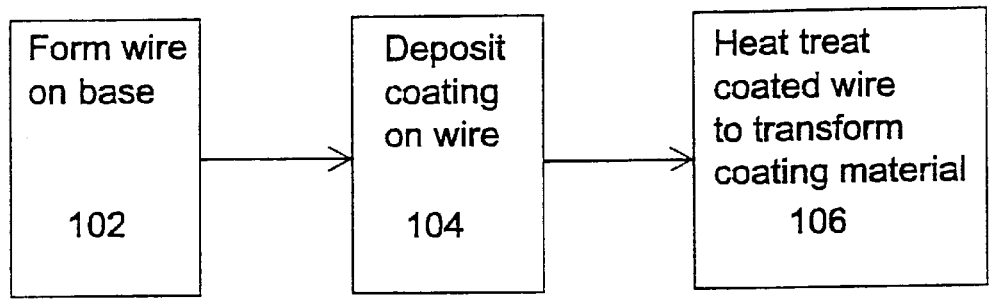
FIG. 1 illustrates a flow chart of a method of manufacturing a coated wire according to a preferred embodiment of this invention.

This invention may start with an uncoated part of practically any shape. Generally speaking, the materials of this invention can be coated onto any suitable base, then heat treated under moderate conditions as described to give a useful product. The base may or may not be retained, depending on the specific application. The deposition of coated material organizes into a desirable structure very early in the coating process, probably within the first few hundred Angstroms of material deposited, and coatings millimeters or even centimeters thick exhibit properties that, when heat treated, provide materials with the improved mechanical properties discussed herein.

When compared to other potential states for the material under study, specific improvements in mechanical properties of the heat treated material may include increased (preferably approximately maximal) yield strength, increased (preferably approximately maximal) elastic modulus, and improved temperature stability. Other potential states include the material as coated (before heat treatment) and the material after extensive annealing (e.g. for stress relief).

One skilled in the art can follow the teachings of this invention to selectively control material properties. For example, the heat treatment can be selected to give minimal ductility, or can be selected to give selectively more ductility. In like manner, one can select heat treatment to give less than the maximal yield strength, or less than the maximal elastic modulus. One might, for example, wish to balance various material properties or accommodate other process constraints but still follow the teachings of this invention to make a material with properties improved over those of the material as coated without heat treatment.

One particularly preferred shape for a base is an elongate member such as a skeleton or a falsework. One preferred skeleton is a wire, which in turn may be supported or secured to a substrate or base. Another preferred skeleton is a beam that is secured to but oriented to stand off from a substrate or base. It is particularly preferable to use an elongate member that can be formed into a spring shape. The elongate member does not need to be resilient, and in fact can be quite flexible to facilitate shaping into an arbitrary or desired form.

The basic material of this invention also can be deposited in other ways. For example, a desired shape can be defined on a substrate such as silicon wafer by application of various materials as is well known in the art. Such materials can include photoresist for some applications. A shape can be defined by patterning, etching, and the like, then prepared for electroplating by depositing a thin seed layer, for instance a layer containing copper metal. The basic material can be plated onto that seed layer and heat treated as described below. Some or even all of the underlying materials may be susceptible to selective removal, leaving the deposited material of this invention partially or completely free of the original substrate. The selective removal may be effected before or after the heat treating step, as desired.

FIG. 1 shows a flow chart of a method of manufacturing a coated wire according to one preferred embodiment of this invention.

Figure 2A:
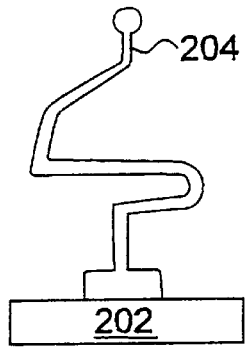
FIG. 2A illustrates a cross-sectional view of a skeleton attached to a base.

First, a microscopic wire skeleton 204 (see FIG. 2A) is formed 102 on a base 202 (see FIG. 2A). For example, the wire skeleton 204 may be made of gold wire, and the formation 102 may be done using a wirebonding machine. The base 202, for example, may comprise a semiconductor substrate. Many other bases 202 are, of course, possible, such as one comprising a ceramic, plastic, or metal substrate.

Second, a coating 206 (see FIG. 2B) is deposited 104 onto the wire skeleton 204. The coating 206, for example, may be an approximately 50-50 (atomic percentage) nickel-cobalt (Ni—Co) alloy deposited in a plating bath that includes saccharin as an additive. The concentration of saccharin in the plating bath is discussed below in reference to FIG. 8. The bath may be changed to vary the Ni/Co ratio, or to include a different additive instead of saccharin. Many variations of the plating bath will work.

In general, coatings based on nickel, cobalt or iron (Ni, Co, Fe) are expected to give generally similar results. Preferred alloys include Ni—Co, Co—Mn, Ni—Mn, and various ternary alloys such as Ni—Co—Mn. Alternative coating materials include Ni—W—B, and Rh. Other possible coatings include Pd, Pd—Au, Pd—Co, W, W—Co, Ti—N, Cu, Cr, Ti, Ti—W, Al, Au, and Pt. Alternative additives include napthalene-tri-sulfonic acid (NTSA), 2-butyne-1,4-diol, and thiourea. Other possible additives include NiCl, NiBr, as well as general Class 1 and Class 2 brighteners. All of these coating materials and additives are well known in the plating art.

Third, the as-coated wire 208 (see FIG. 2B) is submitted to heat treatment 106 at a temperature above a transformation temperature of the coating 206 so that a heat-treated coated wire 212 (see FIG. 2C) is formed. The heat treatment 106 of a Ni—Co alloy, for example, may be done at 350° C. for ten minutes or at 300° C. for sixty minutes. The time and temperature ranges at which the heat treatment 106 should occur (i.e., the heat treatment window) are described below in reference to FIG. 8. Of course for different alloy additive systems, different heat treatment schedules may be required.

FIG. 2A is a cross-sectional view of a wire skeleton 204 attached to a base 202. The skeleton 204 may be formed to be in various shapes, such as the one shown, in order to make useful resilient parts. One useful shape is that of a spring, or a springable shape. Different shapes will be useful depending on the application intended for the resilient part. Alternatively, the skeleton 204 may be a straight wire.

Figure 2B:
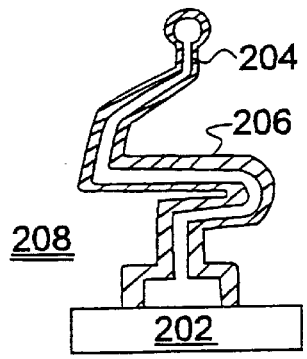
FIG. 2B illustrates a cross-sectional view of an as-coated wire comprising a non-heat-treated coating covering the skeleton.

FIG. 2B is a cross-sectional view of an as-coated wire 208 comprising a coating 206 over the wire 204. The coating 206 is of a thickness sufficient, in relation to the thickness of the skeleton 204, to significantly impact the mechanical properties of the as-coated wire 208. As described below in reference to FIGS. 5A, the as-coated coating 206 has an amorphous or nanocrystalline atomic configuration.

Figure 2C:
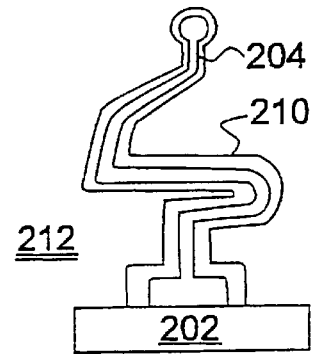
FIG. 2C illustrates a cross-sectional view of a heat-treated coated wire comprising a heat-treated coating covering the skeleton according to a preferred embodiment of this invention.

FIG. 2C is a cross-sectional view of a heat-treated, coated wire 212 comprising a heat-treated coating 210 over the wire skeleton 204. The heat-treated, coated wire 212 is formed by heating 106 the as-coated wire 208 at a temperature greater than a transformation temperature of the non-heat-treated coating 206, preferably for a relatively short time. As described below in reference to FIGS. 5B, the heat-treated coating 210 has a crystalline or ordered atomic configuration. Furthermore, as demonstrated by the test results described below in reference to FIG. 8, the heat-treated, coated wire 212 is resilient and, after being subject to simulated operating conditions, maintains its resiliency much better than the as-coated wire 208.

A representative wire may have a diameter of 1 to 1.5 mils (25 to 38 microns), with a coating thickness on the order of 1.5 mils (38 microns) for a total diameter of about 4 mils (100 microns). Coating thicknesses as small as 200 to 500 Angstroms show the properties discussed here. Coatings can be relatively thick, certainly millimeters and probably on the order of centimeters or greater and still show the properties discussed here.

A useful coating can be deposited using electroplating. A typical plating bath and methodology is as follows. This illustrative, preferred implementation provides an alloy with improved hardness and mechanical properties with approximately a minimum of codeposited sulfur. A preferred grain refiner is sodium benzosulfimide ($C_7H_5NO_3S$), also known as sodium saccharin. This and other grain refiners are well known to one skilled in the art. Although a sulfur containing material is used in this preferred embodiment, this does not appear to be an absolute requirement. For example, 2-butyne-1,4diol has been shown to be effective in practicing the present invention. The additive should promote formation of the desired coating structure, as discussed below.

Electroplating is well understood by one skilled in the art. When the conditions of the outlined electrolyte composition, electrodes, associated current densities, deposit thickness, and specified apparatus are employed, there is no evidence of Ni sulfide precipitation in grain boundaries at the heat treatment temperatures suggested in this disclosure. This absence of precipitation promotes prevention of grain boundary formation and embrittlement, which in turn can lead to premature product failure.

Successful product performance follows from high yield strength accompanied by suitable ductility. Experience has shown that "banded" (or lamellar) coating structures lead to favorable product performance. The addition of grain refining additives; such as napthalene-tri-sulfonic acid (NTSA), NDSA, para-toluene sulfonamide or (preferably) sodium saccharin, will produce this "banding" to further enhance yield strength and desired spring back characteristics in the product. These additives in general should not alloy with but should codeposit with the primary metal or metals being deposited. Thin deposits of certain alloys, including the codeposition of cobalt with nickel, may not show visible "banding" but nevertheless provide significant yield strength.

Alloy Deposition

Although the following solution make-up, control and operating conditions are specific to this preferred embodiment, one skilled in the art of alloy electroplating can produce comparable electrodeposits with superior properties for other applications. Recognized factors which influence the composition of an alloy in electrodeposition include electrolyte Ni/Co ratio in solution; current density, electrolyte agitation, pH, temperature; boric acid and total metal concentration.

Preferred Deposit Properties: As Plated (not heat treated)

Composition: 60%±2% Nickel by wt., 40%±2% Cobalt

Hardness: ¯550 Knoop

Ultimate Strength: σu 265 min ksi (ksi=thousand psi)

Yield Strength: σy 160 min ksi

Modulus: E22±2(Msi) (min. value) (Msi=million psi)

Elongation: 4.5%±5%

Deposit Appearance

The deposit was smooth and continuous, with high spectral reflectance. Conventional Hull Cell Panel tests showed this appearance over a wide range of plating current density.

Typical Solution Make-Up—One preferred implementation of this invention to produce a product with high resiliency is shown in Table 1 below. Plating is carried out in a conventional plating tank, such as a laminar flow polypropylene tank. Plating times and conditions are as needed to give satisfactory coatings.

TABLE 1

TYPICAL MAKE-UP

| CHEMICAL | TYPICAL MAKE-UP |
| --- | --- |
| 1) Ni Sulfamate | 1) 100 gm/L |
| 2) Boric Acid | 2) 38 gm/L |
| 3) Ni Bromide | 3) 3–5 ml/L (@ 18% conc) |
| 4) Co Sulfamate | 4) 8.3 gm/L (8.3 gm Co) |
| 5) Sodium Lauryl Sulfate | 5) 25 dynes/cm |
| 6) Na Saccharin | 6) 100 mg/L |

In a typical process of this invention, these materials can be replaced in whole or in part by the alternative materials in Table 2, below.

TABLE 2

ALTERNATIVE MATERIALS OR COMBINATIONS

| TYPICAL | ALTERNATIVE CHEMICALS |
| --- | --- |
| 1) Ni Sulfamate | 1a) Ni Sulfate |
|  | 1b) Ni Acetate |
|  | 1c) Ni Fluoborate |
|  | 1d) Ni Chloride |
|  | 1e) Ni Sulfate-Chloride |
|  | 1f) Ni Pyrophosphate |
| 2) Boric Acid | 2) Citric Acid |
| 3) Ni Bromide | 3a) Ni Chloride |
|  | 3b) Magnesium Chloride |
| 4) Co Sulfamate | 4a) Co Sulfate |
|  | 4b) Co Chloride |
|  | 4c) Co Fluoborate |
| 5) Wetting Agent | 5) A commercial wetter designed for plating applications |
| 6) Class 1 Brighteners | 6a) Para-toluene sulfonamide |
|  | 6b) Sodium naphthalene trisulfonic acid |
|  | 6c) Naphthalene disulfonic acid |
|  | or a combination of 6a–6c above. |
| 7) Leveling Agents | 7a) Coumarin |
|  | 7b) Quinoline |
|  | 7c) 2-Butyne-1,4-diol |
|  | or a combination of Class 1 brighteners and Leveling agent. |

The coating material can be deposited on a wire which has been shaped in the form of a spring. After appropriate heating, the heat-treated spring substantially maintained its resiliency after being subject to simulated operating conditions. Such a characteristic is very desirable for springs, especially for those used in sockets, interposers, probes, on semiconductors, or in semiconductor packaging, whenever the maintenance of resiliency is important to maintaining pressure contacts. This same characteristic is also beneficial for purely mechanical components of any shape or geometry subject to loads at elevated temperatures for extended periods.

The preferred embodiment described herein is based on a coating over a wire, which may or may not be shaped to a desired form. The teachings of this invention are useful for coating other shapes as well. In particular, the object to be coated may be removed from the new coating before or after the heat treatment step. See, for example, co-pending U.S. patent application Ser. No. 08/802,054 entitled "Microelectronic Contact Structure and Method of Making Same," commonly assigned with the present invention to FormFactor, Inc., now of Livermore, Calif. This and the corresponding PCT patent application, Ser. No. 97/08271, fled May 15, 1997, disclose forming a structure on a substrate, then removing the structure from the substrate to yield a free-standing part. See, for example, FIGS. 3A, 3B and 3C (FIGS. 3A, 3B and 4E, respectively, of the reference applications), which show a structure being formed on a substrate (FIG. 3A), that same structure without the substrate (FIG. 3B), and a structure attached to a different substrate (FIG. 3C). Using the teachings of the present invention, one skilled in the art can coat the structures of FIGS. 3A, 3B and 3C at an appropriate tine to prepare a coating as taught in the present disclosure. For example, spring contact element 460 (FIG. 3C) might be joined to electronic component 470 then coated and heat treated. Alternatively, contact structure 300 (FIGS. 3A, 3B) might be coated and heat treated before removing sacrificial substrate 252.

Figure 3A:
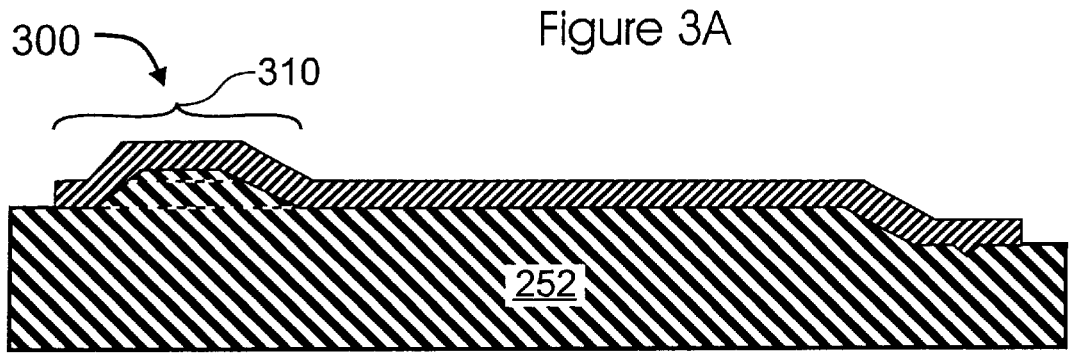
FIG. 3A illustrates a cross-sectional view of an alternate embodiment of an alternate plating substrate, here a spring contact element residing on a sacrificial substrate.
Figure 3B:
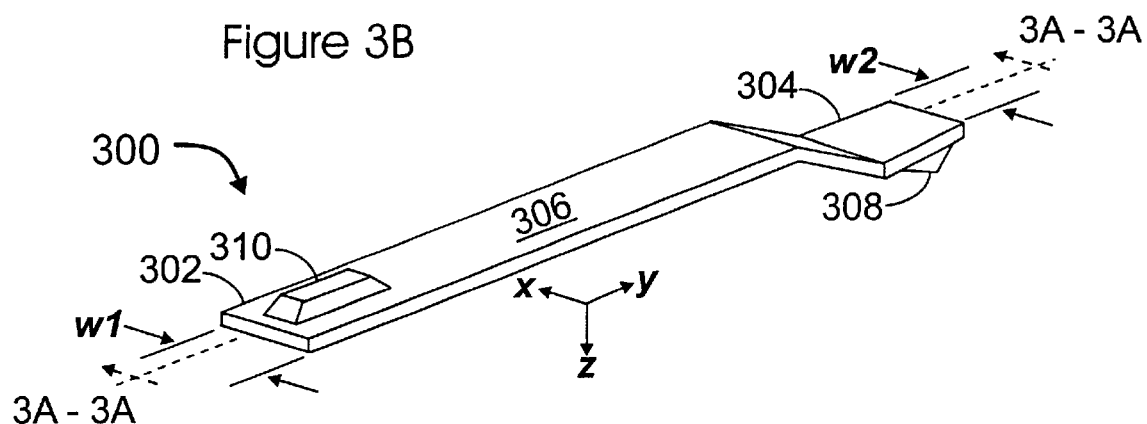
FIG. 3B illustrates a perspective view of the spring contact element of FIG. 3A, omitting a showing of the sacrificial substrate.
Figure 3C:
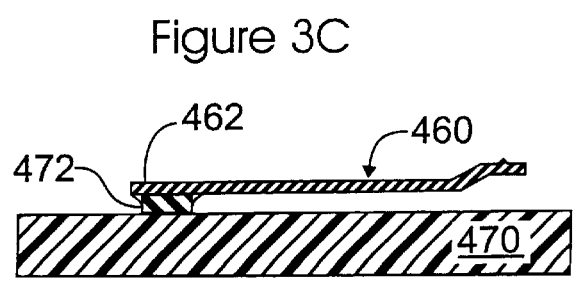
FIG. 3C illustrates a cross-sectional view of another embodiment of a spring contact element mounted to another component.

FIGS. 3A and 3B illustrate another one of many possible embodiments for a contact structure 300 fabricated by the techniques described in the referenced applications. Sacrificial substrate 252 is used for preparing contact structure 300. A somewhat truncated-pyramidal joining feature (stud) 310 is fabricated as an attachment feature at the base portion 302 of the contact structure 300. The remaining portions of the contact structure 300 are a central main body portion 306, a contact end portion 304, and a feature 308, here a contact point. W1 and W2 are widths at the respective ends of the contact structure.

FIG. 3C illustrates an alternate embodiment of the described invention wherein a spring contact element 460 is mounted to an electronic component 470 via a stud 472 extending from a surface of the electronic component 470. The base end 462 of the spring contact element 460 is suitably brazed to the stud 472.

In addition, one skilled in the art could select materials suitable as a substrate for coating, apply the teachings of this invention to apply such a coating, and subsequently remove the substrate to leave a product formed of the coating itself. In a particularly preferred embodiment, a contact structure such as 300 can be built up on a suitable substrate such that the coating forms the bulk of the material of contact structure 300. An alternative substrate might be a conductive layer over a material of a desired shape which might in its own right be readily removable. Such an implementation might start with a shape in wax, photoresist, or other material, then apply a thin conductive layer to promote plating, plate a coating as disclosed in this invention, then heat treat to give a product with the desired shape and properties.

Figure 4:
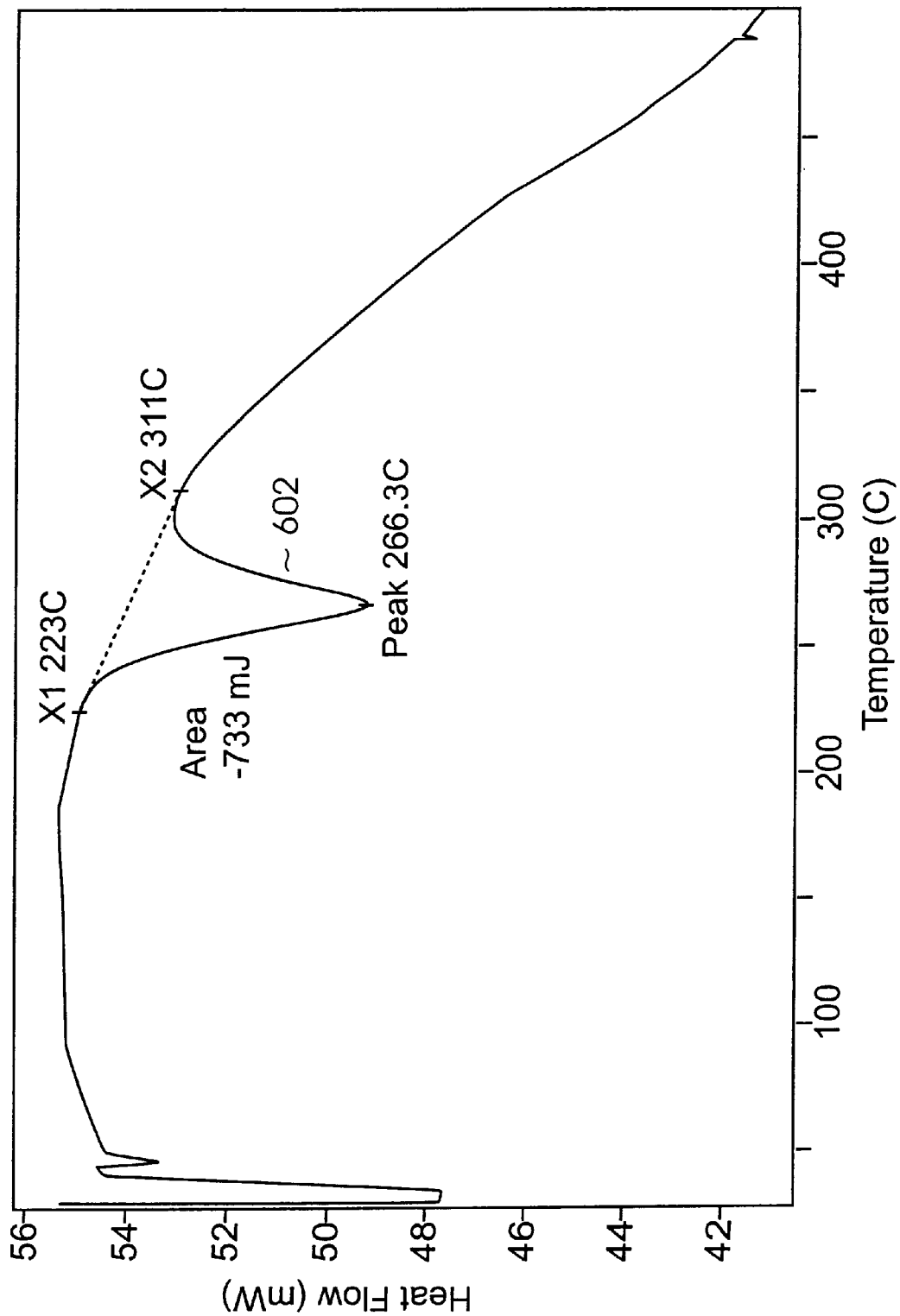
FIG. 4 illustrates a graph of a differential scanning calorimetry measurement of coated material.

FIG. 4 is a graph of a differential scanning calorimetry measurement on as-coated coating 206. The measurement starts with material as coated initially, without heating, and increases its temperature by 10° C. per minute from room temperature (about 30° C.) to 500° C. while measuring heat flow.

The (inverse) peak 602 in the graph centered at about 266° C. indicates that an exothermic transformation occurs in the material, particularly when the temperature is in the range indicated by the width of the peak 602. This exothermic transformation is deduced to be the transformation that changes the microstructure and atomic configuration from that of the as-coated coating 206 to that of the heat-treated coating 210. Since the peak 602 appears to begin above roughly 200° C., a heat treatment 106 above about 200° C. should be able to cause such a transformation when Ni—Co alloy is used as the coating material. However, it is generally preferred to select a temperature near or somewhat above the peak temperature. In the illustrated example, the peak occurs at about 266° C. and useful, preferred heat treatment conditions included 300° C. for 60 minutes or 350° C. for ten minutes. In general, one skilled in the art will recognize that a range of heating temperatures will give the desired effect. In general, a useful temperature range is within 0 and 150° C. above the peak transition temperature and a particularly useful temperature range is within 0 and 100° C. above the peak transition temperature.

A product that has been only partially transformed may be useful as well. One skilled in the art can follow the teachings of this invention to obtain a desired amount of transformation. In general, useful increases in material properties are seen if a substantial portion of the as-coated material undergoes a transformation to a more ordered state. One particularly preferred implementation involves heat treating a coated material at 300° C. for fifteen minutes.

Figure 5A:
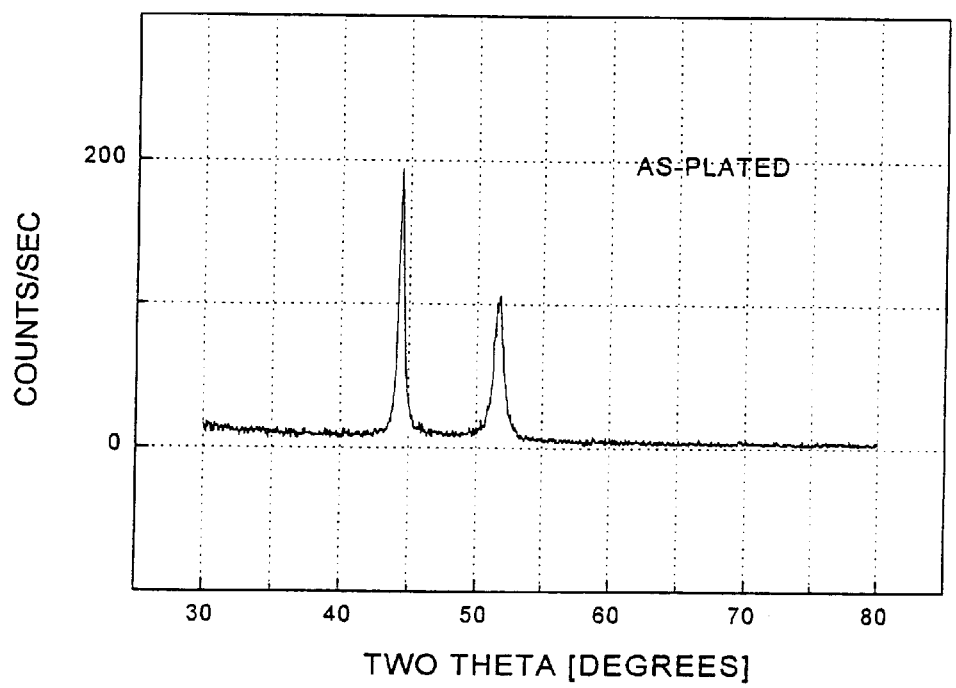
FIG. 5A illustrates a graph of an x-ray diffraction pattern from a sample of as-coated Ni—Co coating material.

FIG. 5A is a graph of an x-ray diffraction pattern from a sample of as-coated coating 206. The significant breadth of the two x-ray diffraction peaks shown in FIG. 5 indicates a relatively small average grain size of about 16 nanometers in the material. (The average gram size was determined using the Debye-Scherrer formula which is well known in the art and gives a lower limit for the average grain size.) With an average grain size of 16 nanometers, the as-coated coating 206 may be characterized as a nanocrystalline or an amorphous material.

Figure 5B:
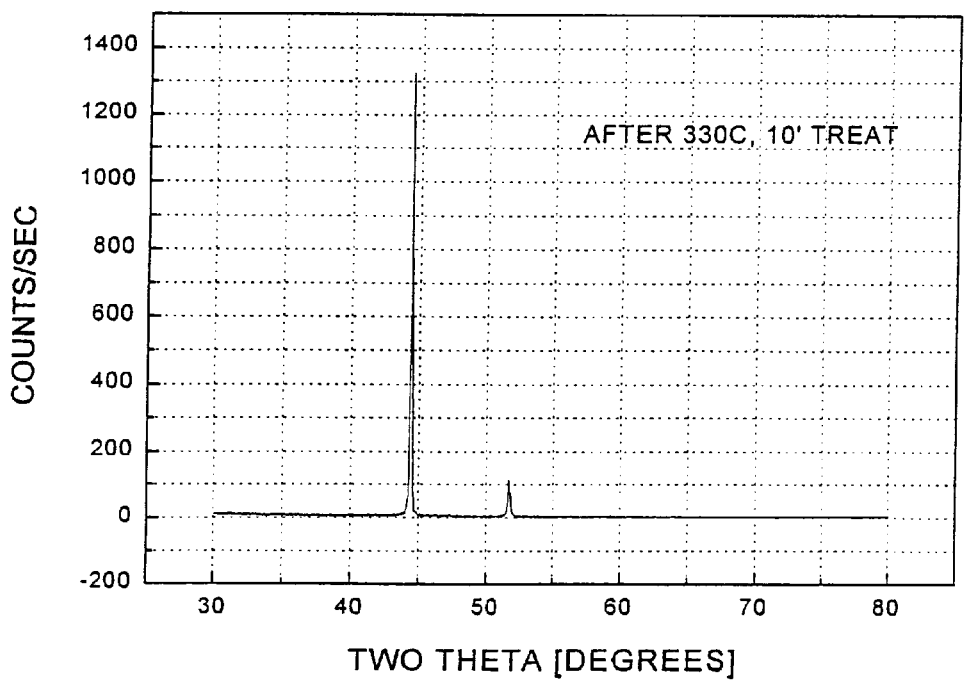
FIG. 5B illustrates a graph of an x-ray diffraction pattern from a sample of heat-treated Ni—Co coating material.

FIG. 5B is a graph of an x-ray diffraction pattern from a sample of heat-treated coating 210 according to a preferred embodiment of this invention. In this case, the heat treatment 106 applied was 10 minutes at 330° C. The narrowness of the two peaks shown in FIG. 5B indicates a relatively large average grain size of about 78 nanometers in the material. (Again, the Debye-Scherrer formula was used.) With an average grain size of 78 nanometers, the heat-treated coating 210 may be characterized as a crystalline or an ordered material.

Thus, as shown by FIGS. 5A and 5B, the coating material undergoes a transformation during heat treatment 106 from nanocrystaline or amorphous to crystalline or ordered.

Figure 6:
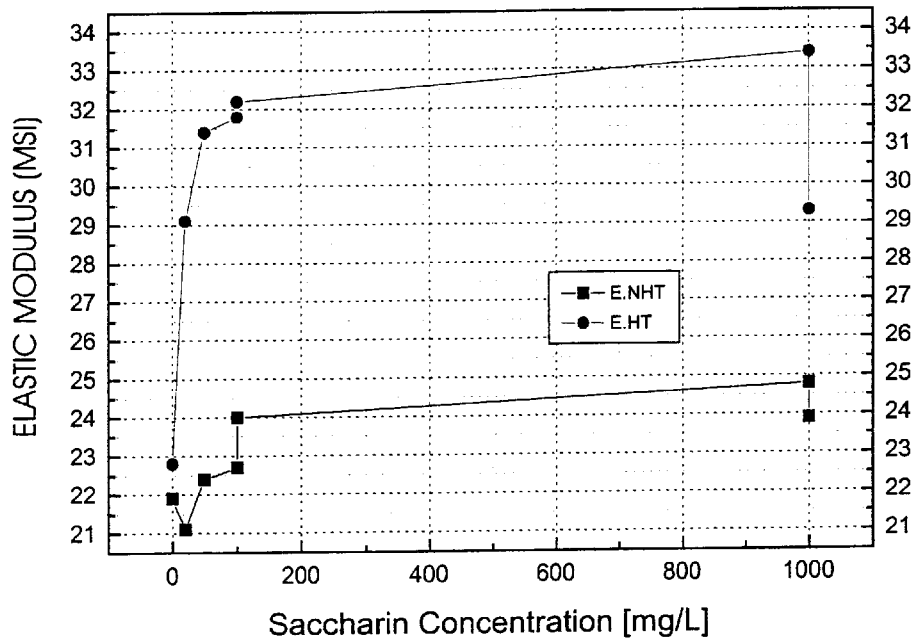
FIG. 6 illustrates a graph of stress versus strain data for an as-coated wire and a heat-treated wire.

FIG. 6 is a graph of stress versus elongation (strain) data for an as-coated wire 208 and a heat-treated wire 212. These wires 208 and 212 tested here are straight, instead of being shaped in the form of a spring, so that the elongation (strain) measurement has meaning as a mechanical property of the material unrelated to the shape of the wires 208 and 212.

The data in FIG. 6 shows that the heat-treated wire 212 has superior mechanical properties compared to the as-coated wire 208. The heat-treated curve 402 shows a higher yield stress (defined as the stress for a 0.2% strain) and higher elastic modulus compared to the as-coated curve 404. Thus the heat treated wire is elastic over a much larger range of applied stress. This indicates a higher resiliency of the heat treated springs, and likely is due to a fundamental materials improvement. Since most mechanical components are designed to operate in the elastic regime (i.e. maintain their shape), a more resilient material is more mechanically stable. Resilient material in the heat treated springs dramatically improves the stability of the mechanical properties at elevated temperatures under load.

When compared to other potential states for the material under study, specific improvements in mechanical properties of the heat treated material may include increased (preferably approximately maximal) yield strength, increased (preferably approximately maximal) elastic modulus, and improved temperature stability. Other potential states include the material as coated (before heat treatment) and the material after extensive annealing (e.g. for stress relief). The improved temperature stability is evidenced by increased resistance to deformation under load at elevated temperatures where the temperature may be somewhat above 25° C., including 85–100° C. and even 300° C. or more. This shows that the material is in a state more stable than the original material as coated.

Figure 7:
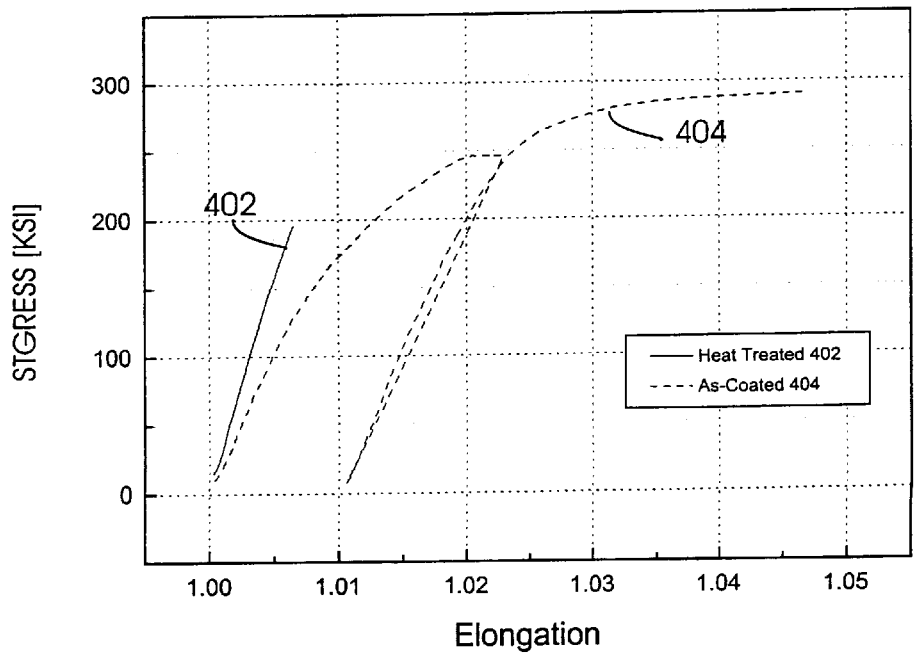
FIG. 7 illustrates a graph of elastic modulus versus saccharin concentration for as-coated and heat-treated wires.

FIG. 7 is a graph of elastic modulus versus saccharin concentration for as-coated ("virgin" or "NHT" in FIG. 7) wires 208 and heat-treated ("heat treated" or "HT" in FIG. 7) wires 212. The graph shows that the elastic modulus for the heat-treated wires 212 is substantially greater than the elastic modulus for the as-coated wires 208 for all non-zero (in particular, 20 mg/L or more) saccharin concentrations tested. When saccharin was used as an additive in the plating bath according to the formulation of Table 1, the heat-treated wires 212 typically had an elastic modulus of about 32 Msi while the as-coated wires 208 typically had an elastic modulus of about 24 Msi. Msi represents "mega" or million psi.

Figure 8:
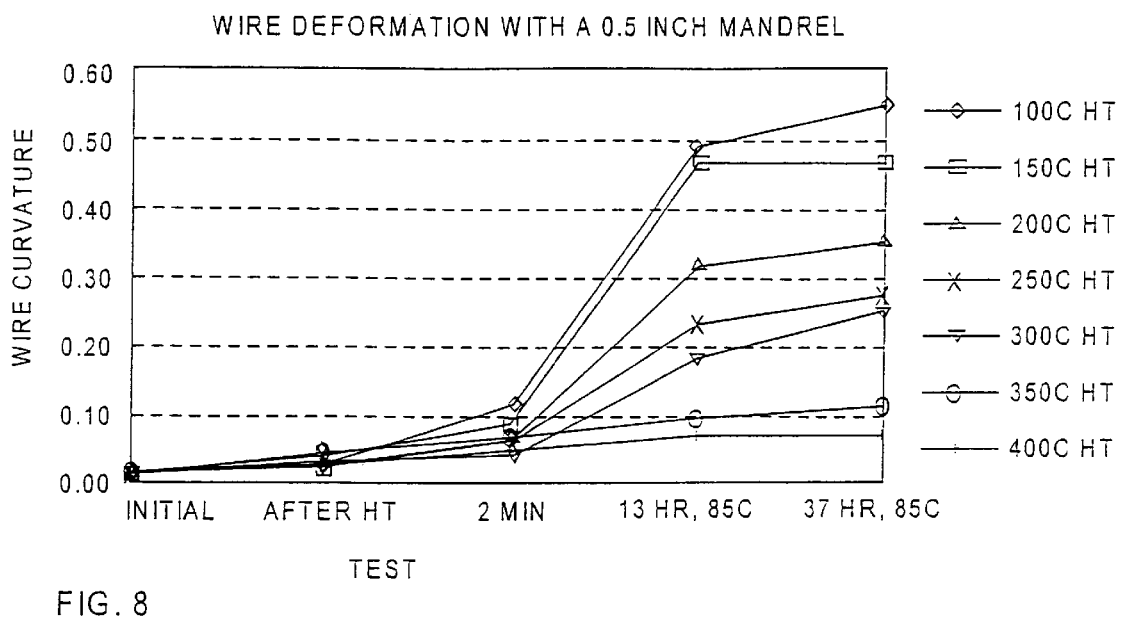
FIG. 8 illustrates a graph of wire curvature before and after heat treatments at various times and temperatures.

FIG. 8 is a graph of the wire curvature under 0.5 inch Mandrel tests on various wires coated with Ni—Co from a bath including saccharin. The Mandrel test consists of wrapping a straight plated wire around a mandrel of a given diameter to produce a fixed strain. (The mandrel material is selected to have the same thermal expansion coefficient as the wire to avoid additional stresses induced by differences in thermal expansion coefficient.) The wire is then attached to the mandrel at both ends to maintain the strain. The mandrel-wire assembly can then be exposed to any time/temperature combination. This test is a convenient way to test material properties under load at elevated temperature as a function of time, an extremely useful means of mimicking different operating conditions. The amount of plastic deformation that occurs for a given test condition is reflected by changes in the resulting wire curvature, where curvature is defined as:

$$\text{curvature} = 100 * \left[ \frac{radius_{outer\text{-}edge\text{-}of\text{-}wire}}{radius_{wire\text{-}center}} - 1 \right]$$

FIG. 8 shows the effect of different heat treatment temperatures on wire curvature. A set of as-plated wires had their curvatures measured at room temperature. They were then subjected to a 7 minute heat treatment at different temperatures, cooled to room temperature, and again measured for curvature. They were subjected to a two minute Mandrel test at room temperature, and again measured for curvature. They were then subjected to a 13 hour Mandrel test at 85° C., cooled to room temperature, and again measured for curvature. Finally, they were subjected to an additional 24 hour Mandrel test at 85° C. (for a total duration of 37 hours at 85° C.), cooled to room temperature, and measured for curvature, As seen in FIG. 8, the plastic deformation associated with mechanical loading, for two minutes at room temperature are nominally the same for the wires heat treated at various temperatures. However, when mechanically loaded at elevated temperatures, the wires heat treated at higher temperatures ($\leq 400°$ C.) show smaller plastic deformation. This is another indication of the improved mechanical properties after heat treatment. The mechanical properties are essentially constant for coated wires heat treated at $T \geq 350°$ C., consistent with the results of FIG. 4 (see corresponding text, above).

The description above has discussed in detail certain Ni and Ni/Co systems with a variety of potential additives, particularly saccharin. However, the general principles can be used to plate a wide variety of systems, with a variety of additives, then heat treated under moderate conditions to give a product with the desired properties.

Potential metal systems are listed in detail above. Additives used to date for the most part include sulfur, but 2-butyne-1,4-diol has been used to give the desired transformation. In one preferred embodiment, a bath concentration of more than or about 5 mg/L 2-butyne-1,4-diol was useful. Although the physical properties are not fully understood, the general theory is that the material as deposited has a non-equilibrium, nanocrystalline structure. The additive is present in relatively low concentration and is dispersed throughout the coating as deposited. If the coated material is heated for some time, the crystal structure reorganizes to give larger crystals. The additive diffuses and primary metal organizes in a way that is affected by the additive molecules, perhaps as a crystal directly incorporating the additive, perhaps as grains that accommodate the additive molecules, or perhaps in some as-yet-not-understood structure. Further heat treatment leads to a different organization where the base material organizes into large structures, excluding the additive and/or the additive collects as a precipitate, segregated from the primary metal. This is the structure that results after traditional annealing (which also generally does not include the additives of the present invention).

To ascertain a usefull amount of additive and useful heat treatment conditions is not difficult. While predictions can be made by studying the diffusion rate of a selected additive in the base metal system, a few experiments will outline the primary parameters very quickly. The temperature range where the intermediate heat treatment is most likely to occur can be selected by coating the desired metal system onto a suitable substrate, then performing differential scanning calorimetry (DSC) as described above. The transition temperature is readily identifiable, and the peak of that transition temperature is a good starting point for subsequent experiments. For this initial experiment, the amount of additive is not very important as the additive has little or no effect on this transition temperature.

A useful amount of additive can be identified by preparing a test product using varying amounts of additive, for example, 2.5%, 1%, 0.1% and 0.01% on a molar basis, then heat treatment for a brief time, for example 5, 10 or 20 minutes, at or near the temperature identified above. The tensile strength of the resulting heat treated product will show which conditions give the desired mechanical properties. A particularly useful test structure is a traditional dog-bone suitable for testing in a traditional tensile strength tester. Alternatively, a coated wire will provide useful tensile information. With initial information about effective amounts of additive, different time and temperature conditions can be evaluated to quickly settle on a useful set of conditions.

For a given amount of additive, upon heat treatment in varying amounts, the yield stress generally will increase to a maximum, but then decrease. In general, the maximum yield stress will be found at a relatively narrow band of heat treatment conditions (balancing time and temperature). This point may not give the desired ductility properties. In general, heat treatment beyond the point of this maximum yield stress condition will increase ductility, and a modest increase in heat treatment will give a part which has close to the maximal yield stress together with a desired amount of ductility. Continued heat treatment ultimately will decrease the yield stress, generally decreasing the resiliency of the treated coating. This continued heat treatment in general will increase ductility. It is well within the skill in the art to identify heat treatment conditions to impart a desired degree of yield stress and a desired degree of ductility in a given coating system, subject to the limitations of that coating system.

One skilled in the art can use the principles of experimental design to identify key components and values with relative ease. This field has been the subject of considerable academic interest. For example, the library at the University of California, Berkeley, listed some 287 references for experimental design in the electronic card catalog in September 1997. See www.lib.berkeley.edu, or, particularly www.lib.berkeley.edu/ENGI/about.html. In particular, the study of factorial experimental designs or fractional factorials may be useful. The Berkeley collection lists some fourteen relevant references. Of particular interest might be the basic references "Statistics For Experimenters, An Introduction to Design, Data Analysis, and Model Building," George E. P. Box, Wiley, N.Y. (1978) and "Empirical Model-Building and Response Surfaces," George E. P. Box and Norman R. Draper, Wiley, N.Y. (1987).

A general description of the device and method of using the present invention as well as a preferred embodiment of the present invention has been set forth above. One skilled in the art will recognize and be able to practice many changes in many aspects of the device and method described above, including variations which fall within the teachings of this invention. The spirit and scope of the invention should be limited only as set forth in the claims that follow.

What is claimed is:

1. A method of fabricating a structure comprising the steps of providing a base part, the part including a shape on which a first material can be deposited, depositing a first material on the shape to give an initial shaped deposit, the first material comprising at least one metal and at least one additive, using a plating bath for depositing the first material wherein the at least one additive is saccharin at a concentration in the plating bath of more than about 20 mg/L, the metal selected from the group consisting of nickel and cobalt, and the at least one additive selected from the group consisting of saccharin and 2-butyne-1,4-diol, and heat treating the initial shaped deposit at a combination of time and temperature to give a heat-treated, shaped deposit with improved material properties.

2. A method of fabricating a structure comprising the steps of providing a base part, the part including a shape on which a first material can be deposited, depositing a first material on the shape to give an initial shaped deposit, the first material comprising at least one metal and at least one additive, using a plating bath for depositing the first material wherein the at least one additive is 2-butyne-1,4-diol at a concentration in the plating bath of more than about 5 mg/L, the metal selected from the group consisting of nickel and cobalt, and the at least one additive selected from the group consisting of saccharin and 2-butyne-1,4-diol, and heat treating the initial shaped deposit at a combination of time and temperature to give a heat-treated, shaped deposit with improved material properties.

* * * * *